(12) United States Patent
Naik et al.

(10) Patent No.: US 12,451,875 B2
(45) Date of Patent: Oct. 21, 2025

(54) HIGH-VOLTAGE SCHMITT TRIGGER (71) Applicant: GlobalFoundries U.S. Inc., Malta, NY (US)

(72) Inventors: Sanmitra Bharat Naik, Bangalore (IN); Asif Iqbal, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 46 days.

(21) Appl. No.: 18/419,686

(22) Filed: Jan. 23, 2024

(65) Prior Publication Data
US 2025/0240000 A1 Jul. 24, 2025

(51) Int. Cl.
*H03K 3/3565* (2006.01)
*H03K 3/356* (2006.01)
*H10D 30/63* (2025.01)
*H10D 30/65* (2025.01)
*H10D 86/00* (2025.01)

(52) U.S. Cl.
CPC ..... *H03K 3/3565* (2013.01); *H03K 3/356104* (2013.01); *H10D 30/637* (2025.01); *H10D 30/65* (2025.01); *H10D 86/201* (2025.01); *H03K 2217/0018* (2013.01)

(58) Field of Classification Search
CPC ......... H03K 2217/0018; H03K 3/3565; H03K 3/356104
See application file for complete search history.

(56) References Cited

U.S. PATENT DOCUMENTS

| | | |
|---|---|---|
| 4,703,201 A | 10/1987 | McGrail |
| 6,147,540 A | 11/2000 | Coddington |
| 6,188,244 B1 | 2/2001 | Joo et al. |
| 6,346,829 B1 | 2/2002 | Coddington |
| 8,293,614 B2 | 10/2012 | Chu et al. |
| 9,306,550 B2 | 4/2016 | Kumar |

(Continued)

FOREIGN PATENT DOCUMENTS

EP 0176211 A1 4/1986

OTHER PUBLICATIONS

U.S. Appl. No. 18/064,978, Office Action dated Aug. 14, 2024, 11 pages.

(Continued)

*Primary Examiner* — Sibin Chen
(74) *Attorney, Agent, or Firm* — David Cain; Hoffman Warnick LLC (57) ABSTRACT

In a disclosed Schmitt trigger, an input stage includes a first p-channel field effect transistor (PFET) and a second PFET, which are connected in series to a VDD rail, and a first n-channel field effect transistor (NFET) and a second NFET, which are connected in series between ground and the second PFET. An output stage includes additional FETs for hysteresis. The first PFET and first NFET are different from the other FETs and have a higher voltage rating. For example, the first PFET and first NFET can be buried oxide field effect transistors (BOXFETs) and the other FETs can be laterally diffused metal oxide semiconductor field effect transistors (LDMOSFETs)). Gates of the first PFET and first NFET are connected to an input node. Gates of the second PFET and NFET are connected to receive reference voltages to prevent safe operating area (SOA) violations and control trigger voltage levels.

18 Claims, 9 Drawing Sheets

(56) References Cited

U.S. PATENT DOCUMENTS

| | | |
|---|---|---|
| 9,467,125 B2 | 10/2016 | Kumar et al. |
| 10,050,115 B2 | 8/2018 | Brown et al. |
| 2005/0104641 A1 | 5/2005 | Chen et al. |
| 2006/0189049 A1* | 8/2006 | Afentakis ............ H03K 3/3565 |
| | | 257/369 |
| 2009/0237135 A1 | 9/2009 | Ramaraju et al. |
| 2016/0105183 A1* | 4/2016 | Kim ................ H03K 19/00315 |
| | | 327/333 |
| 2022/0109437 A1* | 4/2022 | Ma ........................ H03K 3/037 |
| 2023/0238956 A1* | 7/2023 | Chen ............... H03K 3/356113 |
| | | 327/205 |

OTHER PUBLICATIONS

Chen et al., "A New Schmitt Trigger Circuit in a 0.13 μm 1/2.5 V CMOS Process to Receive 3.3 V Input Signals," IEEE 2004, 4 pages.

Donato et al., "A Noise-immune Sub-threshold Circuit Design based on Selective Use of Schmitt-trigger Logic," May 2012, retrieved from: https://www.researchgate.net/publication/234680569 on Nov. 29, 2023, 7 pages.

U.S. Appl. No. 18/064,978, filed Dec. 13, 2022, 32 pages.

Schippel et al., "A 22nm FDSOI Technology with integrated 3.3V/5V/6.5V RFLDMOS Devices for IOT SOC applications," 2018 IEEE SOI-3D-Subthreshold Microelectronics Technology Unified Conference (S3S), pp. 1-3.

Wang et al., "A Novel Orthogonal Gate EDMOS Transistor With Improved dv / dt Capability and Figure of Merit (FOM)," IEEE Electron Device Letters 2008, pp. 1-3.

U.S. Appl. No. 18/064,978, Amendment to Office Action filed Oct. 11, 2024, 14 pages.

European Search Report for U.S. Appl. No. 18/064,978-1205 dated Mar. 13, 2024, 11 pages (corresponding to U.S. Appl. No. 18/064,978).

U.S. Appl. No. 18/064,978, Notice of Allowance dated Jul. 10, 2025, 9 pages.

* cited by examiner

HIGH-VOLTAGE SCHMITT TRIGGER

BACKGROUND

The present disclosure relates Schmitt triggers and, more particularly, to embodiments of a Schmitt trigger with configurable hysteresis.

In fully depleted semiconductor-on-insulator processing technology platforms (e.g., fully depleted silicon-on-insulator (FDSOI) processing technology platforms) Schmitt triggers may include relatively small laterally diffused metal oxide semiconductor field effect transistors (LDMOSFETs) for reduced area consumption. However, these LDMOSFETs have a relatively low safe operating area (SOA) (e.g., a relatively low maximum gate-to-source voltage (VGS-max) limitation of, for example, 2.0V or less), making them impractical for use in high voltage input buffers of receivers (e.g., General Purpose Input Output (GPIO) receivers). Typically, modifying a Schmitt trigger so that it can accommodate high input voltages (e.g., up to 5.0V or beyond) requires additional circuitry, increasing circuit complexity and circuit area.

SUMMARY

Disclosed herein are embodiments of circuit and, particularly, an inverting Schmitt trigger. The inverting Schmitt trigger can include a first p-channel field effect transistor (PFET) and a second PFET connected in series to a positive voltage rail. The inverting Schmitt trigger can further include a first n-channel field effect transistor (NFET) and a second NFET connected in series between a ground rail and the second PFET. In this inverting Schmitt trigger, the gates of the first PFET and the first NFET can be connected to an input node and the gates of the second PFET and the second NFET can be connected to receive different reference voltages.

In some disclosed embodiments, the inverting Schmitt trigger can include a first p-channel field effect transistor (PFET) and a second PFET connected in series to a positive voltage rail. The inverting Schmitt trigger can further include a first n-channel field effect transistor (NFET) and a second NFET connected in series between a ground rail and the second PFET. In these embodiments, the gates of the first PFET and the first NFET can be connected to an input node and the gates of the second PFET and the second NFET can be connected to receive different reference voltages that are specifically variable.

In some disclosed embodiments, the inverting Schmitt trigger can include a first p-channel field effect transistor (PFET) and a second PFET connected in series to a positive voltage rail. The inverting Schmitt trigger can further include a first n-channel field effect transistor (NFET) and a second NFET connected in series between a ground rail and the second PFET. In these embodiments, the first PFET and the first NFET can be buried oxide field effect transistors (BOXFETs) and the second PFET and the second NFET can be laterally diffused metal oxide semiconductor field effect transistors (LDMOSFETs). Furthermore, in these embodiments the gates of the first PFET and the first NFET can be connected to an input node and the gates of the second PFET and the second NFET can be connected to receive different reference voltages that are specifically variable.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, in fully depleted semiconductor-on-insulator processing technology platforms (e.g., FDSOI processing technology platforms), Schmitt triggers may include relatively LDMOSFETs for reduced area consumption. However, LDMOSFETs have a relatively low safe operating area (SOA), making them impractical for use in high voltage input buffers of receivers (e.g., of GPIO receivers). Typically, modifying a Schmitt trigger so that it can accommodate high input voltages (e.g., up to 5.0V or beyond) requires additional circuitry, increasing circuit complexity and circuit area. Furthermore, hysteresis trigger voltage levels of such Schmitt triggers may vary with process-voltage-temperature (PVT) variations (also known as "corners"), negatively affecting performance (e.g., resulting in the output voltage switching earlier or later than desired).

In view of the foregoing, disclosed herein are embodiments of a compact, high-voltage, inverting Schmitt trigger (herein after referred to simply as the Schmitt trigger) where hysteresis is optionally configurable (i.e., selectively adjustable or tunable) to, for example, account for PVT variation. More particularly, in the disclosed embodiments, the Schmitt trigger can include input and output stages. The input stage can include at least four series-connected transistors: a first p-channel field effect transistor (PFET) and a second PFET connected in series to a positive voltage rail and a first n-channel field effect transistor (NFET) and a second NFET connected in series between a ground rail and the second PFET. The output stage can include additional p-channel and n-channel FETs to provide hysteresis. The first PFET and first NFET of the input stage can have a higher voltage rating than all other transistors due to different structural configurations. For example, the first PFET and first NFET can be buried oxide field effect transistors (BOXFETs) and all the other transistors in the Schmitt trigger can be LDMOSFETs. In the input stage, only the gates of the first PFET and the first NFET are connected to an input node for receiving input voltage (Vin), which can, for example, swing between ground and a high voltage (e.g., 5.0V). Gates of the second PFET and second NFET are instead connected to receive different reference voltages. These reference voltages can be preselected to: (1) avoid SOA violations in the second PFET and second NFET; and (2) to set the trigger voltages levels at which the output voltage (Vout) on an output node switches from low to high and high to low in response to changes in Vin at the input node. Optionally, these reference voltages can be variable and, particularly, selectively adjustable to control and, particularly, to fine tune the trigger voltage levels to account for PVT variations. Such a Schmitt trigger can be incorporated into a receiver (e.g., a GPIO receiver) as an inverting input buffer to facilitate down shifting of received data input signals at a data input pad to logic core voltage levels.

Figure 1:
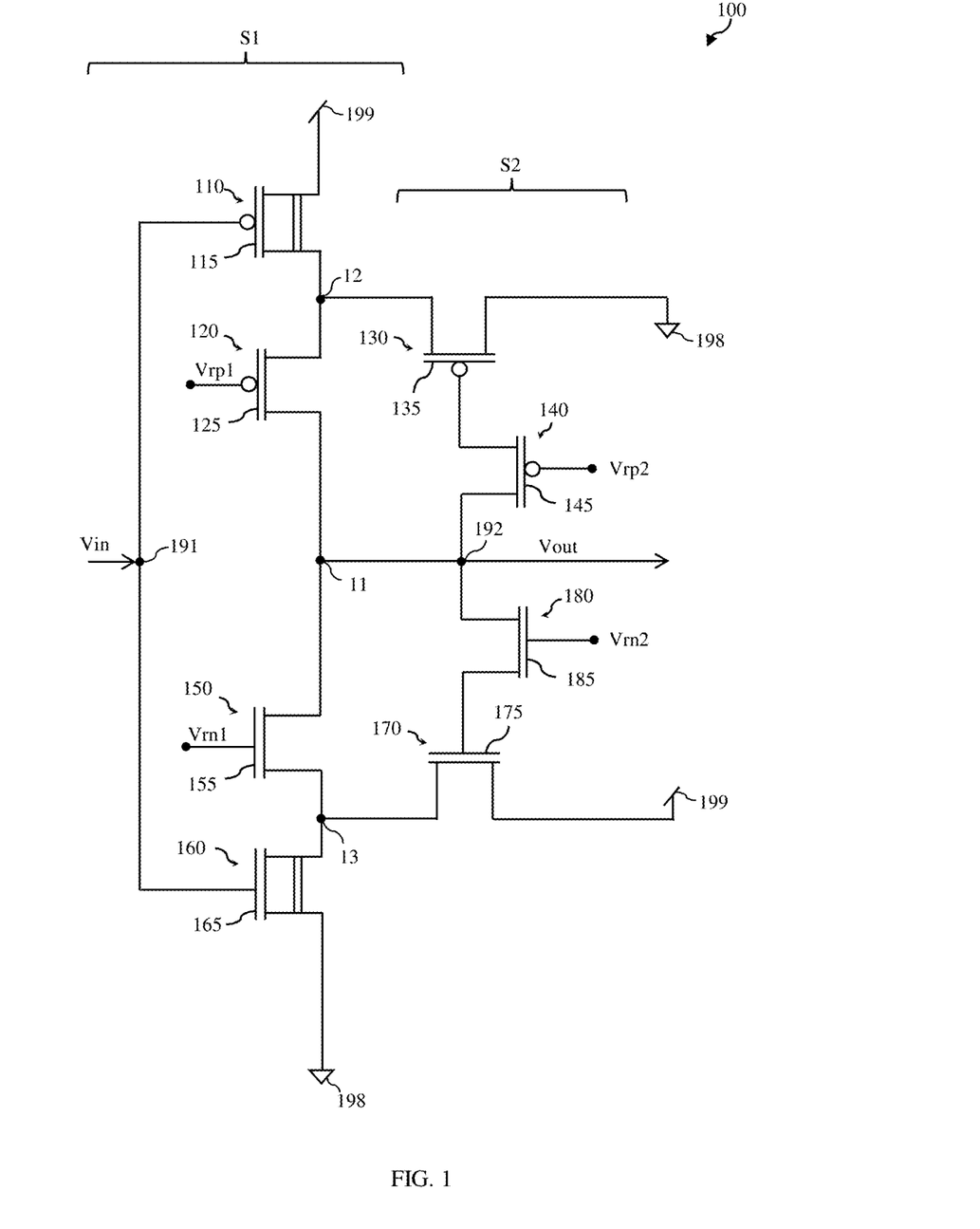
FIG. 1 is a schematic diagram illustrating disclosed embodiments of an inverting Schmitt trigger.

FIG. 1 is a schematic diagram illustrating disclosed embodiments of an inverting Schmitt trigger 100. Schmitt trigger 100 can include an input stage (S1) and an output stage (S2).

Input stage S1 can include an input node 191, which is electrically connected to receive a voltage input signal (Vin). Vin can, for example, be a data input signal received on a data input pad of a receiver (e.g., a GPIO receiver) and can, for example, swing between a low Vin (e.g., at ground (VSS)) indicating a low data value and a high Vin (e.g., at a positive supply voltage (VDD) in, for example, the range of 3.0 volts (V) to 5.5V, such as at 5.0V or even higher) to indicate a high data value.

Input stage (S1) can further include multiple series-connected field effect transistors. These input-stage field effect transistors can include, for example, a first p-channel field effect transistor (PFET) 110 and a second PFET 120 connected in series to a positive voltage rail 199. Specifically, a source region of a first PFET 110 can be electrically connected to a positive voltage rail 199 and a drain region of first PFET 110 can be electrically connected to a source region of a second PFET 120. Additionally, a first n-channel field effect transistor (NFET) 160 and a second NFET 150 can be connected in series between a ground rail 198 and second PFET 120. Specifically, a drain region of second NFET 150 can be electrically connected to a drain region of the second PFET 120 at a first intermediate node 11 and a source region of second NFET 150 can be electrically connected to a drain region of first NFET 160. A source region of first NFET 160 can further be electrically connected directly to ground rail 198 (as illustrated). Alternatively, the source region of first NFET 160 could be connectable to ground rail 198 via an optional footer device (not shown), which controls the on/off state of the Schmitt trigger 100.

In this input stage (S1), first PFET 110 and first NFET 160 can be a first type of FET and second PFET 120 and second NFET 150 can be a second type of FET that is different from the first type. Specifically, the first type can have a first voltage rating (e.g., a first maximum gate-to-source voltage (VGSmax) limitation) and the second type can have a second voltage rating (e.g., a second VGSmax limitation) that is lower than the first voltage rating. For example, in some embodiments, first PFET 110 and first NFET 160 can have a first VGSmax limitation that is at or higher than VDD (e.g., at or above 5.0V) and second PFET 120 and second NFET 150 can have a second VGSmax limitation that is significantly less than VDD, such as less than one-half VDD (e.g., 1.98V). Those skilled in the art will recognize that such a high voltage FET will typically be larger in size (i.e., consume more chip area) than a low voltage FET as well.

For example, in some embodiments, Schmitt trigger 100 can be implemented in an advanced semiconductor-on-insulator processing technology platform (e.g., in a fully depleted silicon-on-insulator (FDSOI) processing technology platform) with first PFET 110 and first NFET 160 being buried oxide field effect transistors (BOXFETs) with a high voltage rating (e.g., of 5.0V or higher) and with second PFET 120 and second NFET 150 being LDMOSFETs with a low voltage rating (e.g., 1.98V). See FIGS. 2A-2E and the detailed discussion of FDSOI FETs, LDMOSFETs, and BOXFETs below.

In any case, in this input stage (S1), first PFET 110 and first NFET 160 only (i.e., not second PFET 120 or second NFET 150) can be electrically connected to input node 191 for receiving Vin. Specifically, gate 115 of first PFET 110 and gate 165 of first NFET 160 can each be electrically connected to input node 191. If the first VGSmax limitation of first PFET 110 and first NFET 160 is 5.0V and VDD is 5.0V, then even when Vin swings downward to 0.0V, these transistors will continue to operate within the SOA. Additionally, in this input stage (S1), second PFET 120 and second NFET 150 can be electrically connected to receive discrete reference voltages (Vrp1 and Vrn1) (instead of being electrically connected to input node 191). Specifically, gate 125 of second PFET 120 can be electrically connected to receive reference voltage (Vrp1) and gate 155 of second NFET 150 can be connected to receive a different reference voltage (Vrn1).

Vrp1 and Vrn1 received by input stage (S1) can be set at voltage levels preselected to avoid SOA violations in the second PFET 120 and second NFET 150. For example, in embodiments of Schmitt trigger 100 as described above, where VDD is 5.0V, where the first VGSmax limitation of first PFET 110 and first NFET 160 is 5.0V, and where the second VGSmax limitation of second PFET 120 and second NFET 150 is 1.98V, Vrp1 can be 3.2V to 4.0V and Vrn1 can be 0.9V to 1.8V to avoid SOA violations in these transistors. Furthermore, Vrp1 and Vrn1 can optionally be variable and selectively adjustable to different levels within the established SOA ranges (e.g., 3.2V to 4.0V for Vrp1 and 0.9V to 1.8V for Vrpn1) to fine tune (i.e., control) hysteresis (e.g., in order to account for PVT variations). Vrp1 and Vrn1 can be received by input stage (S1) from a reference voltage generator (not shown). Reference voltage generators capable of generating multiple variable reference voltages are well known in the art and, thus, are not shown and the details thereof are not described herein in order to allow the reader to focus on the salient aspects of the disclosed embodiments.

Output stage (S2) can include an output node 192 and at least four additional transistors. Specifically, output node 192 can be electrically connected to the first intermediate node 11 in input stage (S1) at the connection between the drain regions of second PFET 120 and second NFET 150. A third PFET 130 can be electrically connected between ground rail 198 and a second intermediate node 12 at the connection between first PFET 110 and second PFET 120. A fourth PFET 140 can be electrically connected between the gate 135 of third PFET 130 and output node 192. Similarly, a third NFET 170 can be electrically connected between positive voltage rail 199 and a third intermediate node 13 at the connection between first NFET 160 and the second NFET 150. A fourth NFET 180 can be electrically connected between the gate 175 of third NFET 170 and output node 192. Optionally, output stage (S2) could include an additional PFET (e.g., a pull-up device, not shown) connected between output node 192 and positive voltage rail 199 in order to control the on/off state of the Schmitt trigger 100.

In this output stage (S2), all of the transistors (e.g., third PFET 130, fourth PFET 140, third NFET 170 and fourth NFET 180) can be configured essentially the same as the second PFET 120 and second NFET 150 of input stage (S1). That is, these transistors can be the second type with the second voltage rating. For example, they can be LDSMOS-FETs with the second VGSmax limitation of, for example, 1.98V.

Additionally, fourth PFET 140 and fourth NFET 180 can be controlled by additional reference voltages (Vrp2 and Vrn2, respectively) and can function as voltage protection devices to avoid SOA violations. Specifically, gate 145 of fourth PFET 140 can be electrically connected to receive additional reference voltage (Vrp2) and gate 185 of fourth NFET 180 can be electrically connected to receive additional reference voltage (Vrn2). Vrp2 and Vrn2 received by output stage (S2) can specifically be preselected to limit the gate voltages on third PFET 130 and third NFET 170, respectively, to prevent VGSmax violations in those transistors. Vrp2 and Vrn2 can, in turn, limit the source voltages of the third PFET 130 and third NFET 170 and, thereby the voltage level at second intermediate node 12 (between the first and second PFETs 110 and 120) and the voltage level at third intermediate node 13 (between the first NFET 160 and second NFET 150), when necessary, to assist with the prevention of VGSmax violations in the input stage S1. As with Vrp1 and Vrn1 applied to the input stage S1, Vrp2 and Vrp2 applied to output stage S2 can be received from a reference voltage generator (not shown).

As mentioned above, in input stage (S1), in addition to being preselected to avoid SOA violations, Vrp1 and Vrn1 can be preselected to control hysteresis. That is, Vrp1 and Vrn1 can also be preselected to establish the trigger voltage levels at which Vout at output node 192 switches from low to high and high to low in responses to changes in Vin at input node 191. Since the disclosed Schmitt trigger 100 is an inverting Schmitt trigger, the high trigger voltage level (VIH) refers to that point at which Vout at output node 192 switches from a high voltage level (e.g., at VDD) to a low voltage level (e.g., at ground) as Vin increases, whereas the low trigger voltage level (VIL) refers to that point at which Vout switches from the low voltage level the high voltage level as Vin decreases. Having a VIH and a VIL as opposed to one trigger voltage level (e.g., as in a conventional inverter), ensures a stable Vout in the presence of noise fluctuation at Vin. Optionally, Vrp1 and Vrn1 can also be variable and selectively adjustable to control and, particularly, fine tune the hysteresis level (e.g., to account for PVT variations).

Figure 2:
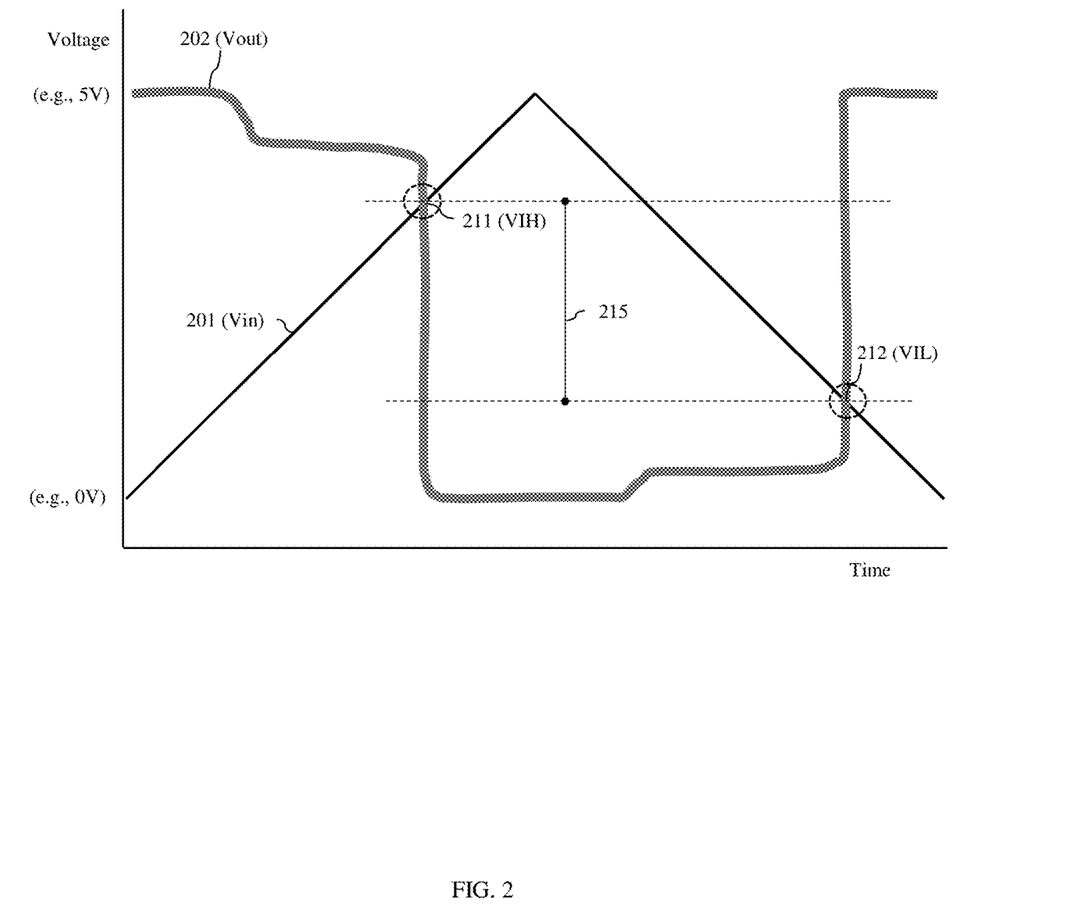
FIG. 2 is an example timing diagram illustrating operation of the Schmitt trigger of FIG. 1.

For example, FIG. 2 is an example timing diagram illustrating operation of the Schmitt trigger 100 as described above and illustrated in FIG. 1, when VDD is 5.0V and VSS is 0.0V such that the VDD to VSS swing is 5.0V, Vrp1 between 3.2 to 4.0V, and Vrn1 between 0.9V to 1.8V. Curve 201 illustrates Vin at input node 191 increasing and then decreasing in voltage over time and curve 202 illustrates concurrent changes in Vout at output node 192. Hysteresis level 215 refers to the difference between VIH at rising edge switch point 211 and VIL at the falling edge switch point 212. By increasing or decreasing Vrp1 and/or Vrn1, the hysteresis level 215 can be adjusted.

Figure 3A:
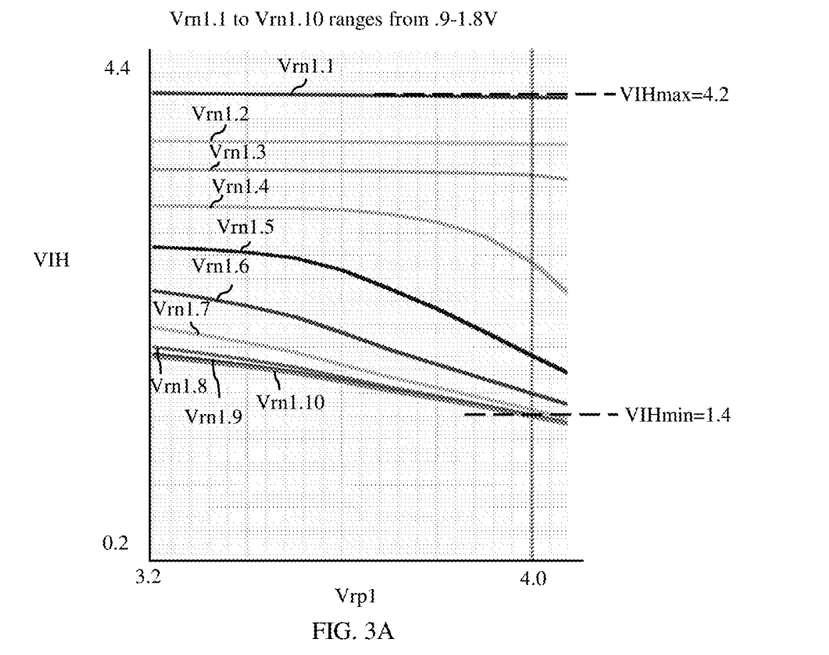
FIG. 3A is a graph illustrating example changes in a high trigger voltage level as a function of changes in a pair of reference voltages received by the Schmitt trigger of FIG. 1.
Figure 3B:
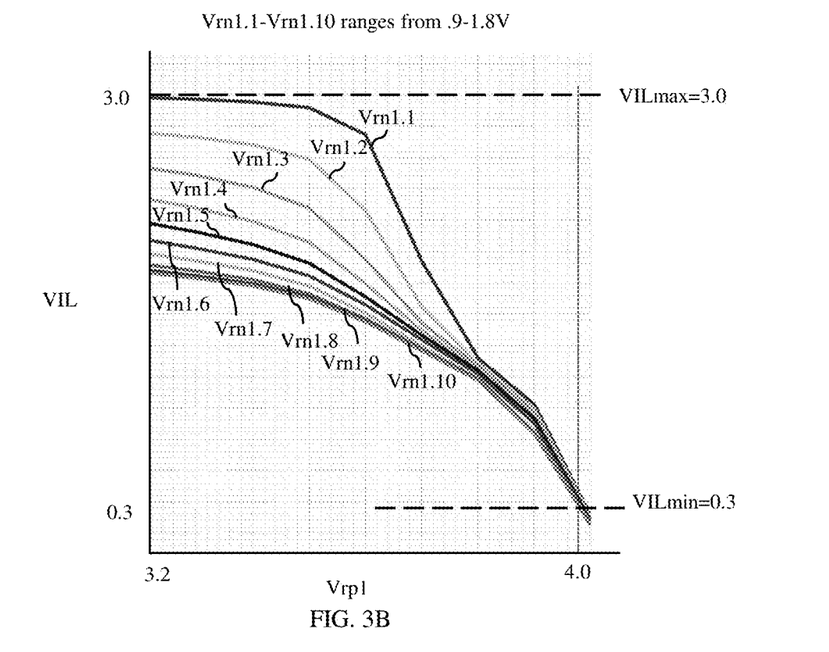
FIG. 3B is a graph illustrating example changes in a low trigger voltage level as a function of changes in a pair of reference voltages received by the Schmitt trigger of FIG. 1.

FIG. 3A is a graph illustrating changes in VIH for different Vrn1 voltages across different Vrp1 voltages. That is, each curve represents changes in VIH with changes in Vrp1 (e.g., from 3.2 to 4.0V) for a fixed Vrn1 (e.g., Vrn1.1=0.9V, and so on until Vrn1.10=1.8V). FIG. 3B is a graph similarly illustrating changes in VIL for different Vrn1 voltages across different Vrp1 voltages. That is, each curve represents changes in VIL with changes in Vrp1 (e.g., from 3.2 to 4.0V) for a fixed Vrn1 (e.g., Vrn1.1=0.9V, and so on until Vrn1.10=1.8V). As illustrated, VIH could be set at any voltage level from a minimum of 1.4V to a maximum of 4.2V, whereas VIL could be set at any voltage level from a minimum of 0.3V to a maximum of 3.0V.

Figure 4:
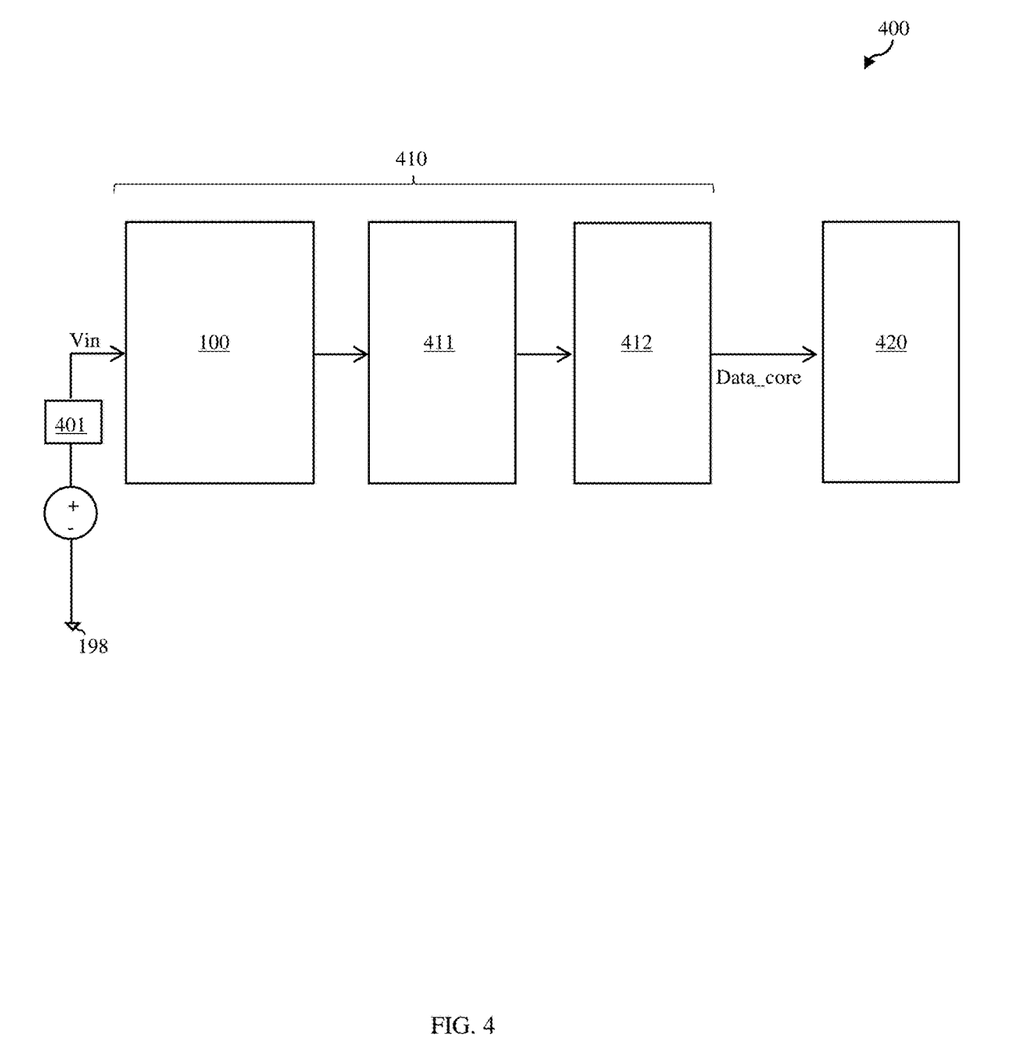
FIG. 4 is a schematic diagram illustrating a chip including an example GPIO receiver that incorporates the Schmitt trigger of FIG. 1.

FIG. 4 is a schematic diagram illustrating a chip 400 including an example GPIO receiver 410 that incorporates the Schmitt trigger 100 of FIG. 1 as an inverting input buffer. The GPIO receiver 410 can include an input/output (I/O) pad 401, Schmitt trigger 100 (also referred to herein as a receiver input inverting stage), a receiver voltage level shifter 411 (also referred to herein as a level shifter or voltage level shifter), and a receiver output stage 412. Schmitt trigger 100 can be connected to receive Vin from the input/output pad 401. As mentioned above, Vin and Vout can swing between VSS and VDD. The receiver voltage level shifter 411 can be configured to receive Vout and to output a level-shifted Vout that swings between VSS and a lower positive supply voltage level (VDDi) (e.g., of 0.5V-1.0V, such as 0.8V). The receiver output stage 412 can include, for example, a pair of series-connected inverters that supply the level-shifted Vout as a data input signal to other on-chip structures for further processing. For example, the data input signal could be logic core input signal (Data_core) provided to logic core 420. Logic core 420 can include combinational and state machine logic configured to implement specific features of the on-chip GPIO receiver.

Voltage level shifters and output stages for receivers (e.g., for GPIO receivers) are well known in the art and, thus, the details thereof have been omitted from this specification in order to allow the reader to focus on the salient aspects of the disclosed embodiments.

Figure 5:
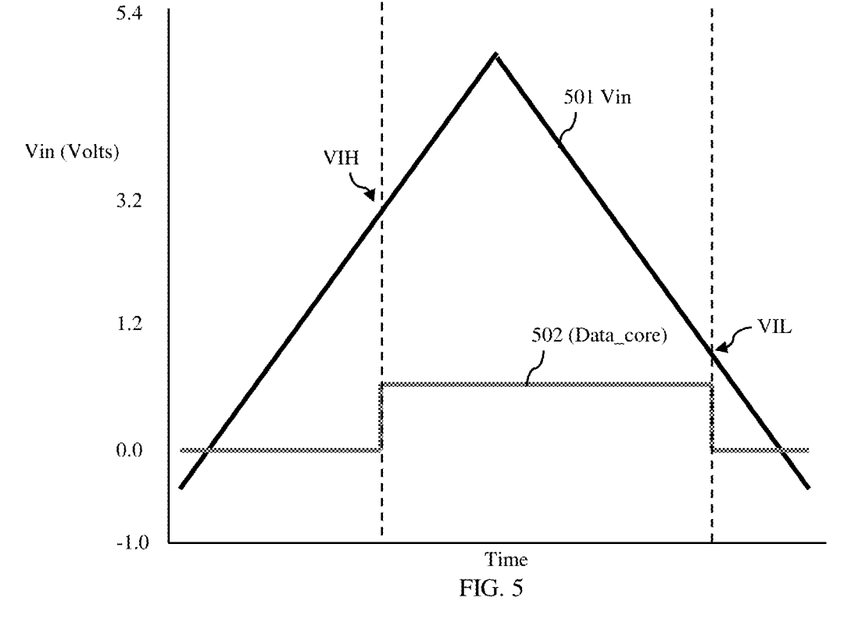
FIG. 5 is an example timing diagram illustrating operation of the GPIO receiver of FIG. 4.

FIG. 5 is an example timing diagram illustrating operation of GPIO receiver 410 as described above and illustrated in FIG. 4. Curve 501 illustrates Vin at input node 191 of Schmitt trigger 100 increasing and then decreasing over time and curve 502 illustrates concurrent changes in Data_core output from receiver output stage 412 to logic core 420. As illustrated, Data_core at is relatively stable with sharp transition between logic 0 (0.0V) and logic 1 (VDDi) and vice versa concurrent VIH and VIL.

Figure 6:
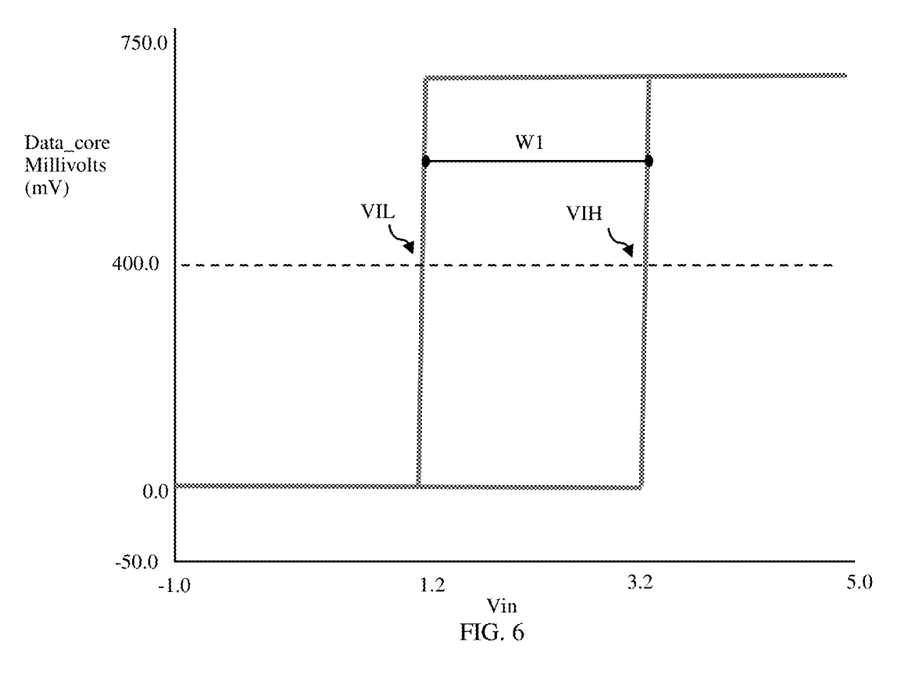
FIGS. 6-8 are graphs illustrating examples of different hysteresis levels that can be achieve in the Schmitt trigger of FIG. 1 by adjusting one or both of the received reference voltages.
Figure 7:
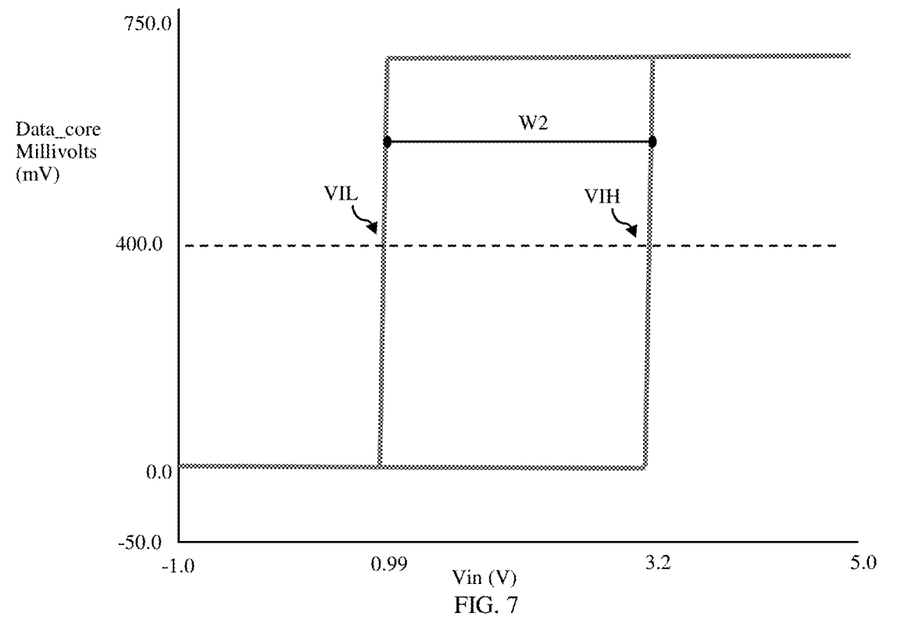
Figure 8:
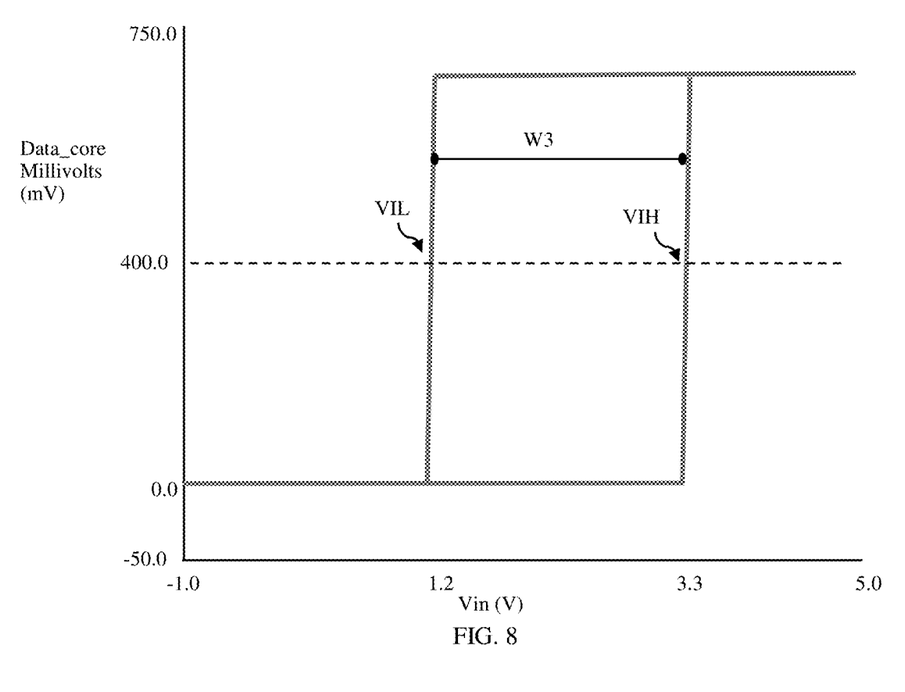

FIG. 6 is a graph illustrating an example hysteresis level of W1 for Data_core. W1 is equal to the difference between a VIH of 3.2V and a VIL of 1.2V (i.e., W1=2.0V) and, as discussed above, is controlled by the voltage levels of Vrp1 and Vrn1. FIG. 7 is a graph illustrating an example of adjusted hysteresis level of W2=2.21V, when VIL is dropped to 0.99V by adjusting Vrp1 and/or Vrn1. FIG. 8 is a graph illustrating an example of another adjusted hysteresis level of W3=2.1V, when VIH is instead raised to 3.3 by adjusting Vrp1 and/or Vrn1.

It should be noted that Schmitt trigger 100 of FIG. 1 (and, if applicable, chip 400 of FIG. 4) can be implemented in an advanced semiconductor-on-insulator processing technology platform (e.g., in a fully depleted silicon-on-insulator (FDSOI) processing technology platform) that includes fully depleted semiconductor-on-insulator FETs (e.g., FDSOI FETs), LDMOSFETs, and BOXFETs. FIGS. 9A-9E are cross-section diagrams illustrating examples of such transistors. FIGS. 9A-9E are provided for illustration purposes and are not intended to be limiting. It should be understood that different configurations for FDSOI FETs, LDMOSFETs, and BOXFETs are known in the art and, alternatively, could be incorporated into the disclosed embodiments.

Figure 9A:
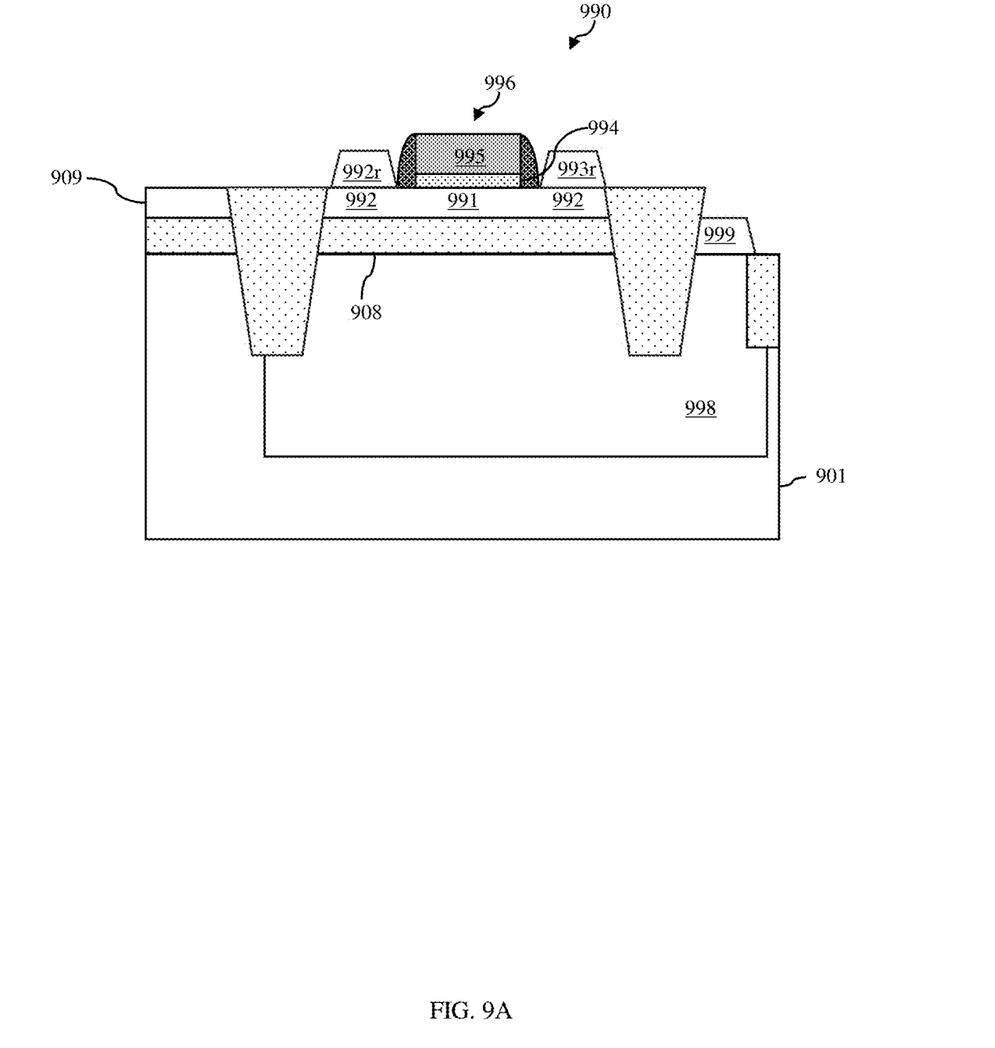
FIGS. 9A-9E are cross-section diagrams illustrating examples of the different types of transistors that can be incorporated into the Schmitt trigger of FIG. 1.
Figure 9B:
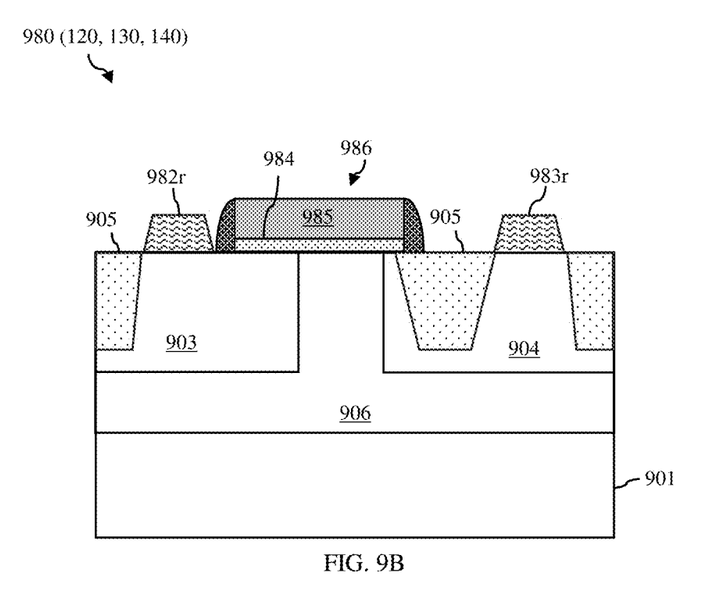
Figure 9C:
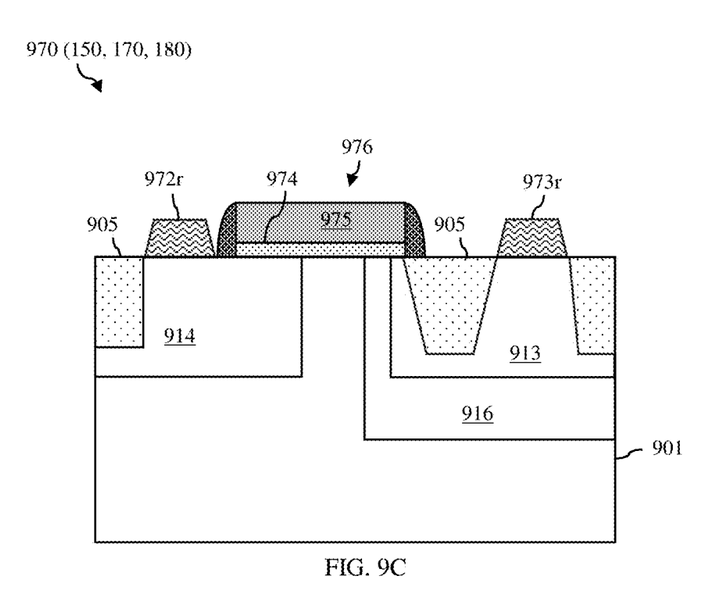
Figure 9D:
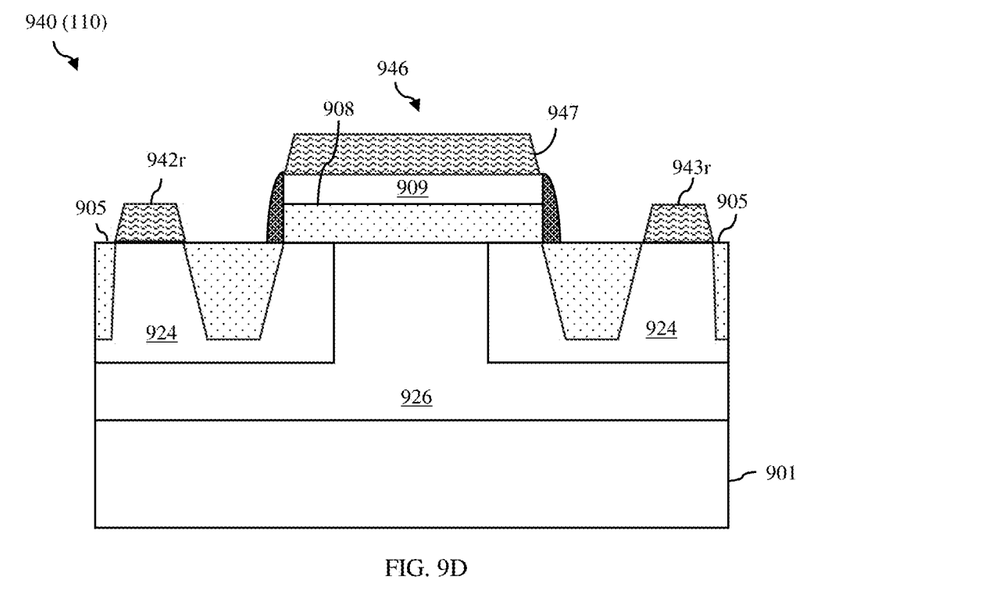
Figure 9E:
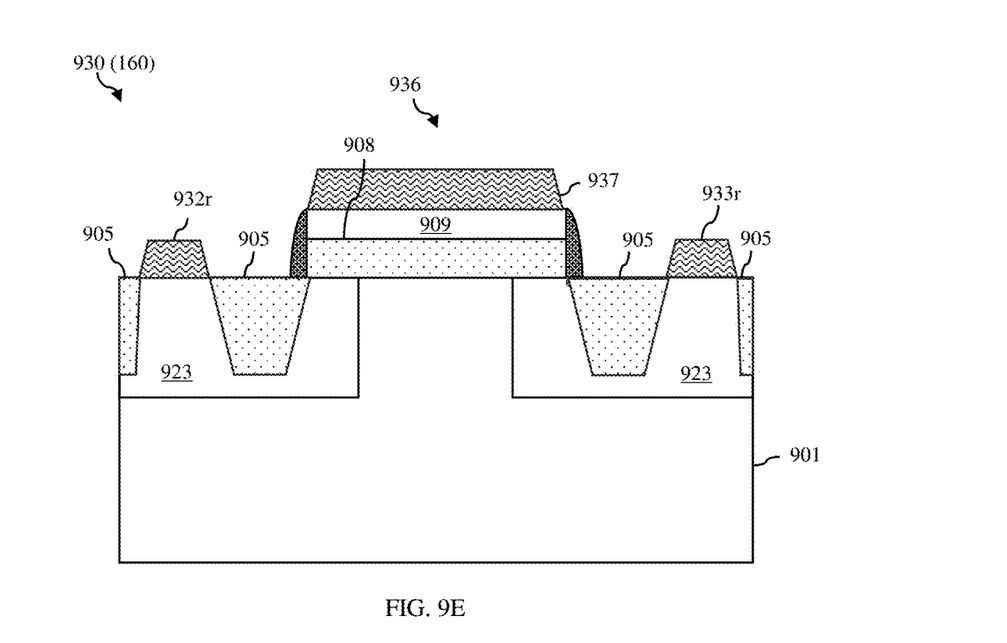

FIG. 9A is a cross-section diagram illustrating an example of a fully depleted semiconductor-on-insulator FET (e.g., a FDSOI FET). Such transistors can, for example, be incorporated into a logic core 420. FIGS. 9B and 9C are cross section diagrams illustrating examples of a P-channel LDMOSFET and an N-channel LDMOSFET, respectively. As mentioned above, P-channel LDMOSFETs can be used for the second, third and fourth PFETs 120, 130 and 140 of Schmitt trigger 100 and N-channel LDMOSFETs can be used for the second, third, and fourth NFETs 150, 170 and 180 of the Schmitt trigger 100. FIGS. 9D and 9E are cross section diagrams illustrating examples of a P-channel BOXFET and an N-channel BOXFET, respectively. As mentioned above, a P-channel BOXFET can be used for the first PFET 110 of Schmitt trigger 100 and an N-channel BOXFET can be used for the first NFET 160 of the Schmitt trigger 100.

Referring to FIGS. 9A-9E, a chip can include a semiconductor substrate 901. The semiconductor substrate 901 can be, for example, a monocrystalline silicon substrate or a monocrystalline semiconductor substrate of any other suitable semiconductor material. The semiconductor substrate 901 can have, for example, P-type conductivity at a relatively low conductivity level. That is, it can be a P-semiconductor substrate.

The chip can include, on semiconductor substrate 901, both semiconductor-on-insulator regions (e.g., silicon-on-insulator (SOI) regions) and bulk regions.

A semiconductor-on-insulator region refers to a region of the chip that includes an insulator layer 908 above and immediately adjacent to the top surface of the semiconductor substrate 901 and a monocrystalline semiconductor layer 909 above and immediately adjacent to the top surface of the insulator layer 908. Insulator layer 908 can be, for example, a silicon diode layer (also referred to herein as a buried oxide (BOX) layer). Insulator layer 908 can be relatively thick (e.g., at least 0.015 µm, >0.020 µm, etc.). Monocrystalline semiconductor layer 909 can be a monocrystalline silicon layer or a monocrystalline layer of any other suitable semiconductor material (e.g., silicon germanium, etc.). A bulk region refers to a region of the chip that is devoid of both insulator layer 908 and semiconductor layer 909 thereon.

Those skilled in the art will recognize that one advantage of such technology processing platforms is that a fully depleted semiconductor-on-insulator field effect transistor 990 (e.g., FDSOI FET) can be formed within a semiconductor-on-insulator region. Specifically, as illustrated in FIG. 9A, an FDSOI FET 990 can include an active device region (including a channel region 991 positioned laterally between source/drain regions 992-993) in semiconductor layer 909 on insulator layer 908. Optionally, FDSOI FET 990 can include raised source/drain regions 992r-993e (e.g., in situ doped epitaxial semiconductor layers) on semiconductor layer 909 above source/drain regions 992-993. A gate structure 996 can be on semiconductor layer 909 adjacent to channel region 991 and isolated from the source/drain regions by gate sidewall spacers. Gate structure 996 can include a relatively thin gate dielectric layer 994 (e.g., less than 0.01 µm) and a gate conductor layer 995 on gate dielectric layer 994. Such a gate structure 996 can be, for example, a gate first gate high-K metal gate structure or any other suitable gate structure.

In any case, the active device region can be aligned above a well region 998 within semiconductor substrate 901. For purposes of this disclosure, a well region refers to a portion of a semiconductor substrate doped so as to have either P-type conductivity (referred to as a Pwell) or N-type conductivity (referred to as an Nwell) at some desired conductivity level. The well region 998 can be either a Pwell or an Nwell, as discussed below. The threshold voltage (VT) of FDSOI FET 990 can vary depending on whether it is a PFET or an NFET and whether it is aligned above an Nwell or a Pwell. For example, for super low threshold voltage (SLVT) or low threshold voltage (LVT) FETs, NFETs can be formed above Nwells and PFETs can be formed above Pwells. For regular threshold voltage (RVT) or high threshold voltage (HVT) FETs, NFETs can be formed above Pwells and PFETs can be formed above Nwells. Typically, a circuit block (e.g., a logic core) will include all SLVT (or LVT) FETs with NFETs above Nwells and PFETs above Pwells or all RVT (or HVT) FETs with NFETs above Pwells and PFETs above Nwells. Whether the FETs are SLVT or LVT FETs or whether they are RVT or HVT FETs will depend upon the design (e.g., device size, etc.) and process specifications (e.g., dopant concentrations, etc.). Another advantage of such technology processing platforms is that back biasing (also referred to herein as back gate biasing) can be employed to fine tune the VTs (regardless of whether the FETs are SLVT/LVT or RVT/HVT FETs. This is achieved by applying different back gate bias voltages to the well region 998 aligned below the FDSOI FET 990 (e.g., via a well tap 999). As mentioned above, FDSOI FETs can be included in the logic core or other sections of a chip Generally, in bulk regions, the chip can include well taps (also referred to herein as well contact regions) that facilitate contacting of the well regions (e.g., in the semiconductor-on-insulator areas and/or in the bulk regions). A well tap can include, for example, an epitaxially grown monocrystalline semiconductor layer (e.g., an epitaxially grown silicon layer or an epitaxially grown layer of any other suitable semiconductor material) on the top surface of semiconductor substrate 901 immediately adjacent to a well region (e.g., see well tap 999 immediately adjacent to well region 998 in FIG. 9A). The well tap can further be doped (e.g., in situ or subsequently implanted) so as to have the same type conductivity as the well region below, optionally at a higher conductivity level.

Additionally, in bulk regions, the chip can include semiconductor devices, such as LDMOSFETs.

As illustrated in FIG. 9B, a P-channel LDMOSFET 980 (such as the second, third and fourth PFETs 120, 130 and 140 in Schmitt trigger 100) can include a deep Nwell 906 in the semiconductor substrate 901. P-channel LDMOSFET 980 can further include an additional Nwell 903 within, shallower than, and having a higher conductivity level than the deep Nwell 906 on a source side of the device. P-channel LDMOSFET 980 can further include a Pwell 904 within and shallower than the deep Nwell 921 on the drain side of the device. The additional Nwell 903 and the Pwell 904 can be physically separated from each other by a portion of the deep Nwell 906. P-channel LDMOSFET 980 can further include, adjacent to Nwell 903, a P+ source region 982r. P-channel LDMOSFET 980 can further include, adjacent to Pwell 904, a P+ drain region 983r, wherein the P+ drain region 983r is laterally separated from a vertical junction between the deep Nwell 906 and Pwell 904 by a trench isolation region 905.

P-channel LDMOSFET 980 can further include a gate structure 986 with gate sidewall spacers on the top surface of semiconductor substrate 901 between the P+ source region 982r and the P+ drain region 983r, but closer to the P+ source region 982r. Gate structure 986 can, for example, extend laterally from above Nwell 903, across the vertical junction between Nwell 903 and deep Nwell 906, across the vertical junction between deep Nwell 906, and Pwell 904 and onto the adjacent trench isolation region 905. Gate structure 986 can be similar to gate structure 996 described above. That is, it can include a relatively thin gate dielectric layer 984 (e.g., less than 0.01 µm) and a gate conductor layer 985 on gate dielectric layer 984. Such a gate structure 986 can be, for example, a gate first gate high-K metal gate structure or any other suitable gate structure. It should be understood that such a P-channel LDMOSFET can further include well contact regions (e.g., on Nwell 903, to deep Nwell 906, etc.). However, to avoid clutter in the drawings and to allow the reader to focus on the salient aspects of the disclosed embodiments such well contact regions are not illustrated in the figure.

As illustrated in FIG. 9C, an N-channel LDMOSFET 970 (such as the second, third and fourth NFETs 150, 170 and 180 in Schmitt trigger 100) can include a Pwell 914 in semiconductor substrate 901 on the source side of the device. The conductivity level of the Pwell 914 can be higher than the conductivity level of the semiconductor substrate 901 (which as mentioned above can be a P-semiconductor substrate). N-channel LDMOSFET can further include a deep Nwell 916 in semiconductor substrate 901 on the drain side of the device such that Pwell 914 and deep Nwell 916 are separated by a portion of the P-semiconductor substrate. N-channel LDMOSFET 970 can further include an additional Nwell 913 within, shallower than, and having a higher conductivity level than deep Nwell 916. Additional Nwell 913 can further be physically separated any junctions between the deep Nwell 916 and the P-semiconductor substrate 901. N-channel LDMOSFET 970 can further include, adjacent to Pwell 914, an N+ source region 972r. N-channel LDMOSFET 970 can further include, adjacent to additional Nwell 913, an N+ drain region 973, which is laterally separated from a vertical junction between deep Nwell 916 and additional Nwell 913 by a trench isolation region 905. N-channel LDMOSFET 970 can further include a gate structure 976 on the top surface of the semiconductor substrate 901 between N+ source region 972r and N+ drain region 973r, but closer to N+ source region 972r. Gate structure 976 can, for example, extend laterally from above Pwell 914, across the vertical junction between Pwell 914 and semiconductor substrate 901, across the vertical junction between semiconductor substrate 901 and deep Nwell 916, across the vertical junction between deep Nwell 916 and additional Nwell 913 and onto the trench isolation region 905. Gate structure 976 can be similar to gate structures 996 and 986 described above. That is, it can include a relatively thin gate dielectric layer 974 (e.g., less than 0.01 µm) and a gate conductor layer 975 on gate dielectric layer 974. Such a gate structure 986 can be, for example, a gate first gate high-K metal gate structure or any other suitable gate structure. It should be understood that such an N-channel LDMOSFET can further include well contact regions (e.g., on Pwell 913, etc.). However, to avoid clutter in the drawings and to allow the reader to focus on the salient aspects of the disclosed embodiments such well contact regions are not illustrated in the figure.

As mentioned above, LDMOSFETs, such as those described above and illustrated in FIGS. 9B and 9C could be used for the second, third and fourth PFETs 120, 130 and 140 and the second, third and fourth NFETs 150, 170 and 180 in Schmitt trigger 100. Such LDMOSFETs are advantageous because the extended drain region increases the drain-source voltage (VDS). However, extending the drain region does not also result in a corresponding increase in the gate-source voltage (VGS). Thus, for example, the drain region of a 1.8V MOSFET can be extended to create an LDMOSFET with a VDS of 5.0V, but its VGS will still be limited to 1.8V (max=1.8+10%=1.98V). Thus, adding such LDMOSFETs to the Schmitt trigger 100 can be beneficial, but care still needs to be taken during circuit design to avoid any VGSmax limits associated with those devices. As mentioned above, in the disclosed embodiments this is achieve by incorporating the fourth PFET 140 and fourth NFET 180 as voltage protections devices and also be using BOXFETs (e.g., with a VGSmax of 5.0V) for the first PFET 110 and first NFET 160 whose gates receive Vin.

As illustrated in FIGS. 9D and 9E, BOXFETs have components in both semiconductor-on-insulator and bulk regions of the chip.

As illustrated in FIG. 9D, a P-channel BOXFET 940 (such as the first PFET 110 in Schmitt trigger 100) can include a deep Nwell 926 in the semiconductor substrate 901. P-channel BOXFET 940 can further include Pwells 924 within and shallower than the deep Nwell 906 on both the source side and drain side of the device. Pwells 924 can be physically separated by a portion of deep Nwell 926. P-channel BOXFET 940 can further include a P+ source region 942r and a P+ drain region 943r adjacent to Pwells 924, respectively. P+ source region 942r and P+ drain region 983r can be laterally separated from vertical junctions between deep Nwell 906 and Pwells 924 by trench isolation regions 905. P-channel BOXFET 940 can further include a gate structure 946 with gate sidewall spacers on the top surface of semiconductor substrate 901 between P+ source region 942r and P+ drain region 943r. In this case, however, gate structure 946 can include stacked portions of insulator layer 908 and semiconductor layer 909 thereon as the gate dielectric and conductor layers. Thus, the gate dielectric layer of gate structure 946 is relative thick (e.g., at least 0.015 µm, >0.02 µm) as compared to the gate dielectric layers of FDSOI FETs and LDMOSFETs. Optionally, gate structure 946 can further include a P-doped monocrystalline epitaxial semiconductor layer (e.g., a P-doped monocrystalline epitaxial silicon layer) on the semiconductor layer 909.

As illustrated in FIG. 9E, an N-channel BOXFET 930 (such as the first NFET 160 in Schmitt trigger 100) can Nwells 923 within semiconductor substrate 901 on both the source side and drain side of the device. Nwells 923 can be physically separated by a portion of P-semiconductor substrate 901. N-channel BOXFET 930 can further include a N+ source region 932r and a N+ drain region 933r adjacent to Nwells 923, respectively. N+ source region 932r and P+ drain region 933r can be laterally separated from vertical junctions between the P-semiconductor substrate 901 and Nwells 924 by trench isolation regions 905. N-channel BOXFET 930 can further include a gate structure 936 with gate sidewall spacers on the top surface of semiconductor substrate 901 between N+ source region 932r and N+ drain region 933r. Gate structure 936 can be similar to gate structure 946 described above. That is, gate structure 946 can include stacked portions of insulator layer 908 and semiconductor layer 909 thereon as the gate dielectric and conductor layers. Optionally, gate structure 936 can further include an N-doped monocrystalline epitaxial semiconductor layer (e.g., a P-doped monocrystalline epitaxial silicon layer) on the semiconductor layer 909.

BOXFETs are advantageous because the thick gate dielectric layer allows the VGSmax limitation to be increased (e.g., to 5.0V). By using BOXFETs for the first PFET 110 and first NFET 160 in the input stage (S1) of Schmitt trigger 100 and LDMOSFETs for the other transistors within the input stage (S1) and in the output stage (S2), no additional circuitry is required within the Schmitt trigger to prevent SOA violations. Even though the BOXFETs are relatively large as compared to LDMOSFETs, no additional circuitry is required within the device to prevent SOA violations because the chip area consumed is reduced over Schmitt triggers that incorporate only LDMOSFETs or only BOXFETs.

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first p-channel field effect transistor (PFET) and a second PFET connected in series to a positive voltage rail;
    a first n-channel field effect transistor (NFET) and a second NFET connected in series between a ground rail and the second PFET,
        wherein gates of the first PFET and the first NFET are connected to an input node to receive an input voltage, and
        wherein gates of the second PFET and the second NFET are connected to receive different reference voltages;
    an output node connected to a first intermediate node between the second PFET and the second NFET;
    a third PFET connected between the ground rail and a second intermediate node between the first PFET and the second PFET;
    a fourth PFET connected between a gate of the third PFET and the output node;
    a third NFET connected between the positive voltage rail and a third intermediate node between the first NFET and the second NFET; and
    a fourth NFET connected between a gate of the third NFET and the output node.

2. The structure of claim 1,
    wherein the first PFET and the first NFET are a first type of field effect transistor with a first voltage rating, and wherein the second PFET, the third PFET, the fourth PFET, the second NFET, the third NFET, and the fourth NFET are a second type of field effect transistor with a second voltage rating that is less than the first voltage rating.

3. The structure of claim 1, wherein the first PFET and the first NFET are buried oxide field effect transistors (BOXFETs), and wherein the second PFET, the third PFET, the fourth PFET, the second NFET, the third NFET, and the fourth NFET are laterally diffused metal oxide semiconductor field effect transistors (LDMOSFETs).

4. The structure of claim 1,
wherein the first PFET and the first NFET each include:
  a first gate dielectric layer; and
  a first gate conductor layer on the first gate dielectric layer and including a monocrystalline semiconductor layer, and
wherein the second PFET, the third PFET, the fourth PFET, the second NFET, the third NFET, and the fourth NFET each include:
  a second gate dielectric layer that is thinner than the first gate dielectric layer; and
  a second gate conductor layer on the second gate dielectric layer and different from the first gate conductor layer.

5. The structure of claim 1, wherein gates of the fourth PFET and the fourth NFET are connected to receive additional reference voltages.

6. The structure of claim 1,
wherein an output voltage at the output node switches from high to low when the input voltage at the input node rises above a first voltage level and switches from low to high when the input voltage drops below a second voltage level that is less than the first voltage level, and
wherein the first voltage level and the second voltage level are controlled by the different reference voltages.

7. A structure comprising:
a first p-channel field effect transistor (PFET) and a second PFET connected in series to a positive voltage rail; and
a first n-channel field effect transistor (NFET) and a second NFET connected in series between a ground rail and the second PFET,
  wherein gates of the first PFET and the first NFET are connected to an input node to receive an input voltage, and
  wherein gates of the second PFET and the second NFET are connected to receive different variable reference voltages;
an output node connected to a first intermediate node between the second PFET and the second NFET;
a third PFET connected between the ground rail and a second intermediate node between the first PFET and the second PFET;
a fourth PFET connected between a gate of the third PFET and the output node;
a third NFET connected between the positive voltage rail and a third intermediate node between the first NFET and the second NFET; and
a fourth NFET connected between a gate of the third NFET and the output node.

8. The structure of claim 7,
wherein the first PFET and the first NFET are a first type of field effect transistor with a first voltage rating, and
wherein the second PFET, the third PFET, the fourth PFET, the second NFET, the third NFET, and the fourth NFET are a second type of field effect transistor with a second voltage rating that is less than the first voltage rating.

9. The structure of claim 7, wherein the first PFET and the first NFET are buried oxide field effect transistors (BOXFETs), and wherein the second PFET, the third PFET, the fourth PFET, the second NFET, the third NFET, and the fourth NFET are laterally diffused metal oxide semiconductor field effect transistors (LDMOSFETs).

10. The structure of claim 7,
wherein the first PFET and the first NFET each include:
  a first gate dielectric layer; and
  a first gate conductor layer on the first gate dielectric layer and including a monocrystalline semiconductor layer, and
wherein the second PFET, the third PFET, the fourth PFET, the second NFET, the third NFET, and the fourth NFET each include:
  a second gate dielectric layer that is thinner than the first gate dielectric layer; and
  a second gate conductor layer on the second gate dielectric layer and different from the first gate conductor layer.

11. The structure of claim 7, wherein gates of the fourth PFET and the fourth NFET are connected to receive additional reference voltages.

12. The structure of claim 11,
wherein an output voltage at the output node switches from high to low when the input voltage at the input node rises above a first voltage level and switches from low to high when the input voltage drops below a second voltage level that is less than the first voltage level, and
wherein the first voltage level and the second voltage level are controlled by the different variable reference voltages.

13. A structure comprising:
a first p-channel field effect transistor (PFET) and a second PFET connected in series to a positive voltage rail; and
a first n-channel field effect transistor (NFET) and a second NFET connected in series between a ground rail and the second PFET,
  wherein the first PFET and the first NFET are buried oxide field effect transistors (BOXFETs),
  wherein the second PFET and the second NFET are laterally diffused metal oxide semiconductor field effect transistors (LDMOSFETs),
  wherein gates of the first PFET and the first NFET are connected to an input node, and
  wherein gates of the second PFET and the second NFET are connected to receive different variable reference voltages.

14. The structure of claim 13, further comprising:
an output node connected to a first intermediate node between the second PFET and the second NFET;
a third PFET connected between the ground rail and a second intermediate node between the first PFET and the second PFET;
a fourth PFET connected between a gate of the third PFET and the output node;
a third NFET connected between the positive voltage rail and a third intermediate node between the first NFET and the second NFET; and
a fourth NFET connected between a gate of the third NFET and the output node.

15. The structure of claim 14, wherein the third PFET, the fourth PFET, the third NFET, and the fourth NFET are LDMOSFETs.

16. The structure of claim 14,
wherein the first PFET and the first NFET each include:
   a first gate dielectric layer; and
   a first gate conductor layer on the first gate dielectric layer and including a monocrystalline semiconductor layer, and
wherein the second PFET, the third PFET, the fourth PFET, the second NFET, the third NFET, and the fourth NFET each include:
   a second gate dielectric layer that is thinner than the first gate dielectric layer; and
   a second gate conductor layer on the second gate dielectric layer and different from the first gate conductor layer.

17. The structure of claim 14, wherein gates of the fourth PFET and the fourth NFET are connected to receive additional reference voltages.

18. The structure of claim 14,
wherein an output voltage at the output node switches from high to low when an input voltage at the input node rises above a first voltage level and switches from low to high when the input voltage drops below a second voltage level that is less than the first voltage level, and
wherein the first voltage level and the second voltage level are controlled on the different variable reference voltages.

* * * * *